United States Patent [19]

Yamauchi

[11] 4,365,107
[45] Dec. 21, 1982

[54] AMORPHOUS FILM SOLAR CELL
[75] Inventor: Yutaka Yamauchi, Nara, Japan
[73] Assignee: Sharp Kabushiki Kaisha, Osaka, Japan
[21] Appl. No.: 235,921
[22] Filed: Feb. 19, 1981
[30] Foreign Application Priority Data
Feb. 19, 1980 [JP] Japan .................................. 55-19951
[51] Int. Cl.³ ............................................ H01L 31/06
[52] U.S. Cl. ................................ 136/258; 204/192 S; 204/192 N; 357/2; 357/30; 427/39
[58] Field of Search ........... 136/258 AM, 262; 357/2, 357/30; 204/192 S, 192 N; 427/39

[56] References Cited
PUBLICATIONS

J. J. Cuomo et al, "Amorphous Heterostructure Solar Cell and Laser", IBM Tech. Disc. Bull., vol. 20, pp. 2061-2062, (1977).
M. H. Brodsky et al, "Hydrogenation and Doping of Amorphous GaAs and Semiconductor Devices Made Therefrom", IBM Tech. Disc. Bull., vol. 20, pp. 4962-4963, (1978).

Primary Examiner—Aaron Weisstuch
Attorney, Agent, or Firm—Birch, Stewart, Kolasch and Birch

[57] ABSTRACT

An amorphous film solar cell of p-i-n heterojunction type, which is produced through the combination of group III-V compound amorphous semiconductor films with a layer of fluorinated or hydrogenated amorphous silicon semiconductor material. Selection of the p-i-n layer construction is easier compared to film solar cells of conventional fluorinated or hydrogenated amorphous silicon semiconductor material, efficiency is improved, and there is an increased degree of freedom in choice of the apparatus.

2 Claims, 1 Drawing Figure

AMORPHOUS FILM SOLAR CELL

BACKGROUND OF THE INVENTION

The present invention relates to an amorphous film solar cell of a p-i-n heterojunction type, which is improved in characteristics through the combined use of at least more than two types of amorphous semiconductor materials.

In recent years, a method of effectively using solar energy has been put into practice. The amorphous solar cells using amorphous silicon film semiconductors are being developed as a lower cost alternative to crystalline solar cells using conventional silicon monocrystal semiconductors (100 to 500 μm in thickness).

The amorphous solar cell is as thin as approxmately 1 μm so that its preparation can conserve energy and materials. Furthermore, the amorphous solar cell can be provided through a relatively simple manufacturing process. Accordingly, the amorphous solar cells are being actively developed as lower cost solar cells.

As this type of amorphous film solar cell, hydrogenated amorphous silicon semiconductor (hereinafter referred to as a a—Si:H) film solar cells, produced by a glow discharge method using monosilane ($SiH_4$) gas as a main component, and fluorinated amorphous silicon semiconductor (hereinafter referred to as a—Si:F:H) film solar cells containing an amorphous alloy of silicon, fluorine and hydrogen produced by a glow discharge method using silicon tetrafluoride ($SiF_4$) gases, as main components are being developed.

The amorphous film solar cell of small area using a—Si:H of the former type provides 5.5% photoelectric conversion efficiency in a Schottky construction and 4.5% in a p-i-n construction. The amorphous film solar cell using the a—Si:F:H of the latter type provides 5.6% or more photoelectric conversion efficiency in a Schottky construction.

As for the construction of the amorphous film solar cells, various kinds are known, such as the p-i-n, Schottky and MIS (metal-insulator-semiconductor) type constructions. The p-i-n type construction is more desirable than the others as a lower-cost film solar cell. This is because series-parallel connection of the unit elements is easier to perform on the same base plate. To construct the p-i-n type film solar cell, it is desirable to use amorphous semiconductors of p type, i (intrinsic) type and n type, which are superior in electrooptical properties. The a—Si:F:H film which is being developed at the present time is a much superior material for the i type or n type semiconductor. However, it has been found out through experiments that the a—Si:F:H film, when a p type impurity B (boron) or the like is added thereto, does not become a p type semiconductor which is superior in electrooptical properties.

SUMMARY OF THE INVENTION

Accordingly, an object of the present invention is to provide an amorphous film solar cell of p-i-n heterojunction type of such characteristics which eliminate the disadvantages inherent in the conventional one as described hereinabove.

Another object of the present invention is to provide an amorphous film solar cell of a p-i-n heterojunction type, which, as compared with the film type solar cells using conventional fluorinated or hydrogenated amorphous silicon semiconductor material, provides an increased degree of freedom of the apparatus design and is improved in efficiency.

A further object of the present invention is to provide an amorphous film solar cell of a p-i-n heterojunction type using an a—Si:F:H or an a—Si:H film as the i type or n type semiconductor to improve the characteristics of the amorphous film solar battery, and using a group III-V compound amorphous semiconductor which is electrooptically superior as the p type or the n type semiconductor.

According to the present invention, there is provided an amorphous film solar cell of a heterojunction type with p-i-n construction as a basic unit, characterized in that a p type or n type amorphous semiconductor layer is made of a group III-V compound semiconductor material and at least the i (intrinsic) type semiconductor is made of a fluorinated or hydrogenated amorphous silicon semiconductor material.

The III-V compound amorphous semiconductor is composed of group III A elements (B, Al, Ga, In) and group VA elements (N, P, As, Sb) of the periodic table of chemical elements. They are amorphous semiconductor materials of tetrahedral structure and include materials such as a—BN, a—BP, A—AlN, a—AlP, a—GaN, a—GaP, a—GaAs, a—InN, a—InP, a—InAs, a—InSb or alloys thereof (such as a—BGaP, a—GaInP or the like). These group III-V compound amorphous semiconductors are formed by glow discharge, sputtering or ion plating methods.

The optical band gaps of the a—Si:H film and the a—Si:F:H film are, respectively, 1.55 eV and 1.65 eV. On the other hand, the band gap of the a—BP film is approximately 2.1 eV and that of the a—InP film is approximately 1.3 eV. The variable combinations of the III-V elements allows the optical band gap to be optionally selected, thus resulting in an increased degree of freedom of design of the amorphous film solar cell.

These and other objects, features, aspects and advantages of the present invention will become more apparent from the following detailed description of the present invention when taken in conjunction with the accompanying drawing.

DESCRIPTION OF THE PREFERRED EMBODIMENT

EXAMPLE 1

Figure 1:
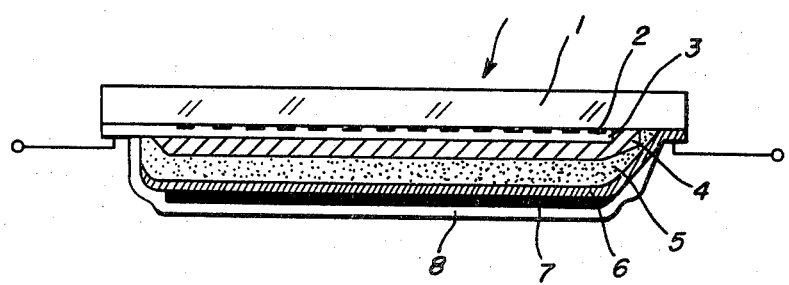
FIG. 1 is a cross-sectional view of an amorphous film solar cell of a p-i-n heterojunction type comprising a glass/ITO/p+—a—BP/i—a—Si:F:H/n+—a—Si:F:-H/Al—Ag/Si—O—N layered construction formed in accordance with the present invention.

Referring to FIG. 1 showing a specific example of the amorphous film solar cell of p-i-n heterojunction type in accordance with the present invention, the grid electrode 2 of Cr—Au/Ag is evaporated through a mask onto transparent glass base plate 1 by means of an electron beam evaporating apparatus. Then an $In_2O_3$—$SnO_2$ (ITO) transparent electrode 3 is formed in a thickness of approximately 700 A by means of a sputtering apparatus, using In—Sn alloy as the target. The resistance at this time is 20–30Ω/□ and the light transmission factor is 89% or more in the visible region.

Then, the base plate is placed in a plasma CVD apparatus. The a—BP film 4 is formed in a thickness of 100–600 A, at a base plate temperature of 350° C., gas pressure of 0.5-2 torr, high frequency power of 100 W, using a mixed reactant gas (for example, $PH_3/H_2$ at a flow rate of 40 cc per minute, $B_2H_6/H_2$ at a flow rate of 50 cc per minute) of phosphine (5% $PH_3$ in $H_2$ carrier) and diborane (5% $B_2H_6$ in $H_2$ carrier) gas. The a—BP becomes a p type amorphous semiconductor due to control of the reactant gas ratio of the $PH_3$ to the $B_2H_6$ and has a growth rate of 0.05-0.4A per second. The deposited a—BP film 4 is a transparent light-brown film.

Then, a fluorinated amorphous silicon film (a—Si:F:H) 5 is formed in a thickness of 5,000-10,000 A by plasma CVD, under the conditions of 50 cc per minute gas flow, 350° C. base plate temperature, 100 W high frequency power and 1 torr gas pressure. The reactant materials of the a—Si:F:H are a mixture (mixture ratio 9:1) of silicon tetrafluoride ($SiF_4$) gas and hydrogen. The film has a growth speed of 1-4 A per second, and is electrically an intrinsic (i) type. Then, n—type doping agent phosphine (0.1% $PH_3$ in $H_2$ carrier) is added in the amount of 0.1-1% to silicon tetrafluoride ($SiF_4/H_2$) gas to form n+ type a—Si:F:H film 6 into a thickness of 300-500 A. Al/Ag back electrode 7 is formed in a thickness of 1 to 5 μm by means of an electron beam evaporating apparatus. Finally, a silicon oxynitride film 8 ($Si_xO_yN_z$, 1-15% in the ratio of 0 with respect to N) is formed to a thickness of 700-1500 A in the plasma CVD apparatus, and is used to passivate the solar cell. The reactant materials used to make the silicon oxynitride film are monosilane gas ($SiH_4/H_2$), ammonia ($NH_3$) and nitrous oxide gas ($N_2O$). The silicon oxynitride film is produced under the conditions of 50 W high frequency power, 350° C. base plate temperature and 1-2 torr gas pressure.

In the above-described embodiment, during the production of the p type a—BP film 4, 0.1-1% dimethyl zinc ($(CH_3)_2 Zn$) was added by bubbling through $H_2$ gas, to reactant gases $PH_3/H_2$ and $B_2H_6/H_2$ to perform the glow discharge operation, thus resulting in the p+ type a—BP film of low resistance. Similarly, 0.05-1% silicon tetrafluoride ($SiF_4$) gas was added to the reactant gases $PH_3/H_2$ and $B_2H_6/H_2$ to perform the glow discharge operation, thus resulting in the n+ type a—BP film of low resistance.

The p-i-n heterojunction type solar cell of ITO/p+—a—BP/i—a—Si:F:H/n+—a—Si:F:H/Al—Ag structure showed the superior characteristics of 0.75 V open circuit voltage, 15 mA per cm$^2$ in short-circuit current, FF of 0.53 and photoelectric conversion efficiency η of 5.9% under AMI solar light.

EXAMPLE 2

A solar cell of p-i-n heterojunction construction approximately similar to that of example 1, wherein the n+ layer 6 was composed of a—InP will now be described.

The n-type a—InP can be made by a plasma CVD method through the use of phosphine (5-10% $PH_3$ in $H_2$ carrier) and trimethyl indium ($(CH_2H_5)_3$ In).

The relationship between the doping agent and the reactant gases of the particular group III-V amorphous semiconductor to be produced by the glow discharging method of the invention is given in the Table below.

TABLE

| III - V Amorphous Material | Main Reactant Gases | n Type Doping Agent | p Type Doping Agent |
| --- | --- | --- | --- |
| a - BN | $B_2H_6$, $NH_3$ | $SiH_4$, $SiF_4$, $H_2S$ | — |
| a - BP | $B_2H_6$, $PH_3$ | $SiH_4$, $SiF_4$, $H_2S$, $H_2Se$ | $SiH_4$, $(CH_3)_2Zn$ |
| a - AlN | $(CH_3)_3Al$, $(C_2H_5)_3Al$, $NH_3$ | $SiH_4$, $SiF_4$, $H_2S$ | — |
| a - AlP | $(CH_3)_3Al$, $(C_2H_5)_3Al$, $PH_3$ | $SiH_4$, $SiF_4$, $H_2S$ | — |
| a - GaN | $(CH_3)_3Ga$, $(C_2H_5)_3Ga$, $NH_3$ | $SiH_4$, $SiF_4$, $H_2S$ | — |
| a - GaP | $(CH_3)_3Ga$, $(C_2H_5)_3Ga$, $PH_3$ | $SiH_4$, $SiF_4$, $H_2S$, $H_2Se$ | $SiH_4$, $(CH_3)_2Zn$ |
| A - GaAs | $(CH_3)_3Ga$, $(C_2H_5)_3Ga$, $AsH_3$ | $SiH_4$, $SiF_4$, $H_2S$, $H_2Se$ | $SiH_4$, $(CH_3)_2Zn$ |
| a - InN | $(C_2H_5)_3In$, $NH_3$ | $SiH_4$, $SiF_4$, $H_2S$ | — |
| a - InP | $(C_2H_5)_3In$, $PH_3$ | $SiH_4$, $SiF_4$, $H_2S$, $H_2Se$ | $SiH_4$, $(CH_3)_2Zn$ |
| a - InAs | $(C_2H_5)_3In$, $AsH_3$ | $SiH_4$, $SiF_4$, $H_2S$, $H_2Se$ | $SiH_4$, $(CH_3)_2Zn$ |

The above-described group III-V compound amorphous film can be n+ type or p+ type and can be selectively used as the n+ layer or the p+ layer of the p-i-n heterojunction type amorphous film solar cell.

As the method of producing the group III-V amorphous film semiconductor, the plasma CVD method utilizing glow discharge operation has been described hereinabove. Each of these group III-V materials can produce an amorphous film which is electrically and optically superior and can be made by sputtering, a reactive sputtering, or ion plating method.

According to the present invention, the amorphous film type solar cell is produced through the combination of group III-V amorphous films with a layer of fluorinated or hydrogenated amorphous silicon semiconductor material. Selection of the p-i-n layer construction becomes easier compared to conventional fluorinated or hydrogenated amorphous silicon semiconductor solar cells, efficiency is improved, and there is an increased degree of freedom in the apparatus design.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An amorphous film solar cell of heterojunction type having a p-i-n construction, comprising a p type or n type amorphous semiconductor layer made of a group III-V material and at least an i (intrinsic) type semiconductor layer made of fluorinated or hydrogenated amorphous silicon semiconductor material.

2. An amorphous film solar cell of p-i-n heterojunction type in accordance with claim 1, wherein the group III-V amorphous semiconductor is made of a—BN, a—BP, a—AlN, a—AlP, a—GaN, a—GaP, a—GaAs, a—InN, a—InP, a—InAs, a—InSb, or alloys thereof produced by glow discharge, sputtering or ion plating.

* * * * *